(12) United States Patent
Kim et al.

(10) Patent No.: US 7,160,803 B2
(45) Date of Patent: Jan. 9, 2007

(54) METHOD OF FORMING METAL LINE IN SEMICONDUCTOR DEVICE

(75) Inventors: Tae Kyung Kim, Icheon-si (KR); Jik Ho Cho, Anyang-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/159,227

(22) Filed: Jun. 23, 2005

(65) Prior Publication Data
US 2006/0189130 A1   Aug. 24, 2006

(30) Foreign Application Priority Data
Feb. 23, 2005   (KR)   ...................... 10-2005-0014954

(51) Int. Cl.
*H01L 21/44*   (2006.01)
(52) U.S. Cl. .................. 438/653; 438/656; 438/685
(58) Field of Classification Search ........ 438/625–628, 438/631, 637, 638, 643, 644, 648, 656, 685, 438/687, 653
See application file for complete search history.

(56) References Cited

U.S. PATENT DOCUMENTS

| 6,562,715 | B1 * | 5/2003 | Chen et al. ................. 438/643 |
| 6,727,592 | B1 * | 4/2004 | Woo et al. .................. 438/648 |
| 2002/0016063 | A1 * | 2/2002 | Chen et al. ................. 438/653 |

FOREIGN PATENT DOCUMENTS

JP   11-307474   11/1999

\* cited by examiner

*Primary Examiner*—Kevin M. Picardat
(74) *Attorney, Agent, or Firm*—Mayer Brown Rowe & Maw LLP

(57) ABSTRACT

A method of forming a line a semiconductor device, including the steps of forming an interlayer insulating film on a semiconductor substrate in which predetermined structures are formed, forming a trench through which a predetermined region of the semiconductor substrate is exposed in the interlayer insulating film, sequentially forming a glue layer and a first barrier metal film on the entire surface including the trench, forming a second barrier metal film at the bottom of the trench, and forming a line within the trench.

39 Claims, 2 Drawing Sheets

METHOD OF FORMING METAL LINE IN SEMICONDUCTOR DEVICE

BACKGROUND

1. Field of the Invention

The present invention relates to a method of forming a metal line in a semiconductor device. More specifically, the present invention relates to a method of forming a metal line of a semiconductor device, wherein line resistance of the line can be reduced, and line burial characteristics and electrical characteristics can be improved.

2. Discussion of Related Art

As the line width of semiconductor devices was miniaturized and the degree of integration thereof increased, it became impossible to fulfill a desired line width through a line formation method using an existing Reactive Ion Etch (RIE) process. Recently, lines have been formed by means of a damascene method.

In case of the line formation method using the damascene method, a metal line material has to be deposited/buried in a pattern region that is formed in the form of a trench, unlike the RIE method.

A source contact of a NAND flash memory device is a type of this trench pattern, and it has a three-dimensional structure unlike the contact structure. It is thus difficult to deposit and bury the metal line material.

Generally, in semiconductor devices, tungsten (W) using a Chemical Vapor Deposition (hereinafter, referred to as "CVD") method is used as a main metal line material. Before tungsten (W) is deposited, $TiSi_x$ for electrical ohmic contact and a glue layer for improving adhesion are formed. The glue layer generally employs a Ti film.

When CVD tungsten (W) is the main metal line material, $WF_6$ is used as a deposition gas. Fluorine (F) of $WF_6$ is infiltrated from the bottom of a trench into a semiconductor substrate, thus increasing line resistance. In a worse case, a short problem (hereinafter, referred to as "F-attack") is generated. There also occurs a problem in that tungsten (W) of $WF_6$ and the Ti film being the glue layer react to each other in an explosive manner (hereinafter, referred to as "W volcano"). It is thus required to form a barrier metal layer having a predetermined thickness using a material such as TiN, TaN or TiW, which has a resistance relatively higher than that of the main metal line material. In the case of flash memory devices of 70 nm grade, a barrier metal film is formed to a thickness of about 100 Å or more.

Recently, a TiN film having good step coverage, which is deposited by means of CVD method, has generally been used as the barrier metal film. The CVD TiN film is formed to a constant thickness regardless of the top, middle and bottom portions of a trench due to its good step coverage. The TiN film formed on the sidewalls of the trench causes a volume of a portion where a subsequent main metal line material will be buried to be reduced. The inlet of the trench becomes narrow toward the top of the trench, thus causing a seam or void. This seam or void further reduces the volume of the main metal line material, and thus results in an increased line resistance.

More particularly, the metal line of the damascene structure is a three-dimensional structure unlike RIE method, and is thus largely dependent upon the structure of the glue layer and the barrier metal film. Furthermore, this phenomenon becomes more profound when the line structure is miniaturized, and thus causes failure in deposition and burial of the main metal line material. It results in reduction of the volume of the line and formation of the void within the line, thus increasing resistance. It also has a bad influence on electrical characteristics.

The easiest and most reliable method for improving the burial characteristics and electrical characteristics of the main metal line material is to reduce a thickness of the barrier metal film and thus to increase the importance occupied by the main metal line material. If the thickness of the barrier metal film is lower than a predetermined thickness, however, there is a problem in which resistance of a semiconductor substrate increases due to $WF_6$ gas since the original object of the barrier metal film is lost, or a F attack problem in which the line and the semiconductor substrate are shortened, a W volcano problem in which the glue layer (Ti) under the barrier metal film and $WF_6$ react to each other in an explosive way, and the like.

SUMMARY OF THE INVENTION

Accordingly, the present invention has been made in view of the above problems, and it is an object of the present invention to provide a method of forming a line in a semiconductor device, wherein the volume occupied by a main metal line material is sufficiently secured within a trench, and F attack and W volcano problems can be prevented.

Another object of the present invention is to provide a method of forming a line of a semiconductor device, wherein generation of a void or seam upon formation of a main metal line can be prevented.

Further another object of the present invention is to provide a method of forming a line of a semiconductor device, wherein line resistance of the line can be minimized.

To achieve the above objects, according to the present invention, there is provided a method of forming a line in a semiconductor device, including the steps of forming an interlayer insulating film on a semiconductor substrate in which predetermined structures are formed, forming a trench through which a predetermined region of the semiconductor substrate is exposed in the interlayer insulating film, sequentially forming a glue layer and a first barrier metal film on the entire surface including the trench, forming a second barrier metal film at the bottom of the trench, and forming a line within the trench.

The first barrier metal film may, in embodiments, be formed by means of a CVD process.

The first barrier metal film may, in embodiments, be formed to a thickness of 20 to 50 Å.

The first barrier metal film may, in embodiments, be formed by means of an ALD process.

The first barrier metal film may, in embodiments, be formed to a thickness thinner than 20 Å.

The second barrier metal film may, in embodiments, be formed using one of TiN, WN and TaN.

The step of forming the second barrier metal film at the bottom of the trench can include forming the second barrier metal film at the bottom of the trench and on the first barrier metal film other than the trench, depositing a line material so that the trench is buried, and then polishing the surface so that the interlayer insulating film is exposed, thereby forming the line within the trench.

The second barrier metal film may, in embodiments, be formed to a thickness of 50 to 100 Å.

The line may, in embodiments, be formed using one of W, Ti, TiN, W alloy, Al alloy and Cu.

The second barrier metal film may, in embodiments, be formed by means of a PVD method.

The second barrier metal film may, in embodiments, be formed by means of collimate PVD or ionized PVD.

In the event that the second barrier metal film is formed by means of collimate PVD, the second barrier metal film can be formed under the conditions having a pressure of 10 to 50 mTorr, DC power of 1000 to 5000 Watt, and RF power of 500 to 5000 Watt.

In the event that the second barrier metal film is formed by means of ionized PVD, the second barrier metal film can be formed under the conditions having a pressure of 10 to 50 mTorr, DC power of 1000 to 5000 Watt, RF power of 500 to 5000 Watt, and AC power of 100 to 500 Watt.

DETAILED DESCRIPTION OF PREFERRED EMBODIMENTS

Embodiments according to the present invention will be described with reference to the accompanying drawings. Since the embodiments are provided so that a person of ordinary skill in the art will be able to understand the present invention, they may be modified in various manners and the scope of the present invention is not limited by the embodiments described herein.

FIGS. 1A to 1E are cross-sectional views showing process steps of forming a metal line in a semiconductor device according to an embodiment of the present invention.

Figure 1A:
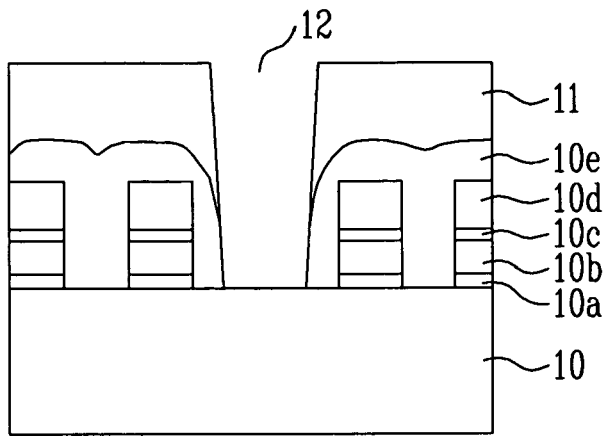
FIGS. 1A to 1E are cross-sectional views showing process steps of forming a metal line in a semiconductor device according to an embodiment of the present invention.

Referring first to FIG. 1A, an interlayer insulating film 11 is formed on a semiconductor substrate 10 in which predetermined structures are formed. The interlayer insulating film 11 is etched to expose a desired portion of the semiconductor substrate 10, thus forming a trench 12.

In this case, the trench 12 preferably has sides of a profile that is almost perpendicular.

The predetermined structure may have a variety of shapes depending upon devices. The embodiment shown in the drawing is a flash memory device. The predetermined structures include a stack gate in which a tunneling oxide film 10a, a floating gate 10b, an intergated insulating film 10c and a control gate 10d are sequentially laminated on the semiconductor substrate, and spacers 10e on the sides of the stack gate.

Figure 1B:
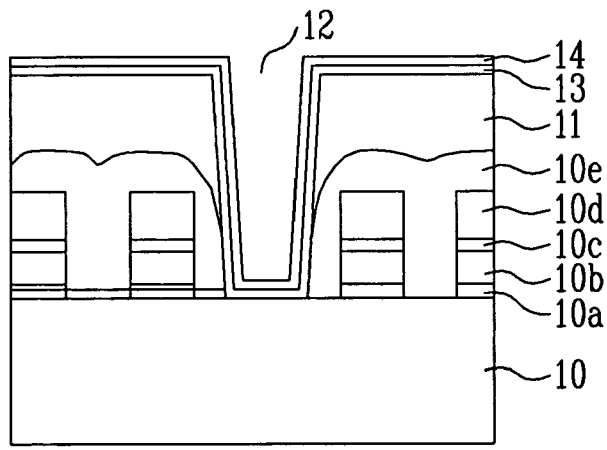

Thereafter, as shown in FIG. 1B, a glue layer 13 and a first barrier metal film 14 having good step coverage are formed on the entire surface including the trench 12.

The glue layer 13 can be formed by depositing a Ti film. The first barrier metal film 14 can be formed by depositing a TiN film to a thickness of 20 to 50 Å by means of a CVD method having good step coverage, or by depositing a TiN film to a thin thickness of below 20 Å using an Atomic Layer Deposition (ALD) method which allows for deposition control of a thin film.

In the prior art, the barrier metal film was thickly formed to a thickness of about 100 Å due to the F attack problem, the W volcano problem, etc. so that the barrier metal film does not become lower than a predetermined thickness. In the present invention, however, the barrier metal film is preferably formed to a minimum thickness as thin as possible so that the thickness of the first barrier metal film 14 can be minimized.

The material of the first barrier metal film 14 may employ WN or TaN as well as TiN.

Figure 1C:
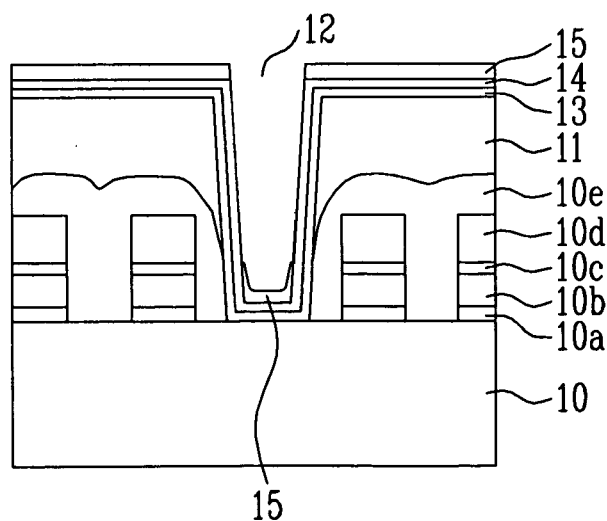

Referring next to FIG. 1C, in order to solve the F attack problem, the W volcano problem, etc., which are caused as the first barrier metal film 14 decreases below the predetermined thickness, a second barrier metal film 15 is formed on portions except for the sidewalls of the trench 12, i.e., at the bottom of the trench 12 and on the first barrier metal film 14 outside the trench 12 by means of a deposition method having strong straightness.

The second barrier metal film 15 can be formed to a thickness of 50 to 100 Å using one of TiN, WN and TaN.

Further, the deposition method of the second barrier metal film 15 includes a Physical Vapor Deposition (hereinafter, referred to as "PVD") method. It is, however, preferred that a collimate PVD or an ionized PVD method among the PVD methods is used. More particularly, it is most preferred that the ionized PVD method having excellent straightness is used.

In the event that the collimate PVD method is used, the process is performed under the conditions having a pressure of 10 to 50 mTorr, DC power of 1000 to 5000 Watt, and RF power of 500 to 5000 Watt. In the case where the ionized PVD method is used, the process is performed under the conditions having a pressure of 10 to 50 mTorr, DC power of 1000 to 5000 Watt, RF power of 500 to 5000 Watt, and AC power of 100 to 500 Watt.

By using the deposition method having strong straightness, the second barrier metal film 15 is not formed on the sidewalls of the trench 12, but formed only at the bottom of the trench 12 and the flat surface outside the trench 12.

As a result, as the first and second barrier metal films 14 and 15 are formed at the bottom of the trench 12, a thickness of a layer serving as a barrier is thick. Further, since only the first barrier metal film 14 is formed on the sidewalls of the trench 12, a thickness of a layer serving as a barrier is thin. As such, when burying the main metal line material using $WF_6$ gas, the F attack problem and the W volcano problem can be prevented, and a space where a line is formed can be sufficiently secured.

As noted before, the PVD method has a process time that is shorter than that of the CVD method. In the present invention, the process time can be shortened by introducing the second barrier metal film 15 formed by the PVD method, instead of reducing the thickness of the first barrier metal film 14 formed by the CVD method.

Figure 1D:
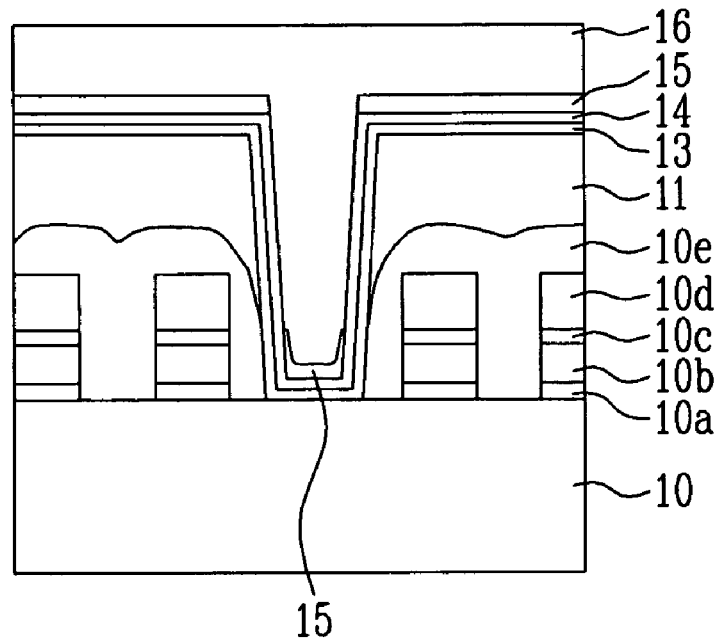

Referring next to FIG. 1D, a tungsten film 16 is deposited using a main line material on the entire surface including the trench 12 so that the trench 12 is completely buried.

In this case, the main line material may include any one of Ti, TiN, W alloy, Al alloy and Cu in addition to tungsten (W). The deposition method may include the CVD or ALD method.

Figure 1E:
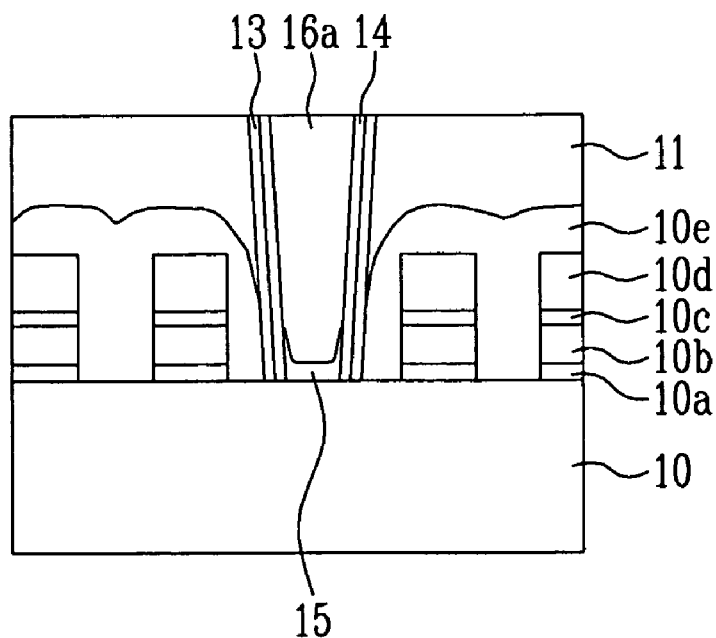

Referring to FIG. 1E, the tungsten film 16, the second barrier metal film 15, the first barrier metal film 14 and the glue layer 13 are polished by means of Chemical Mechanical Polishing (hereinafter, referred to as "CMP") so that the interlayer insulating film 11 is exposed, thus forming a line 16a within the trench 12.

Manufacturing the line of the semiconductor device according to an embodiment of the present invention is thus completed.

As described above, the present invention has the following effects.

First, the volume of a line can be sufficiently secured since a thickness of a barrier metal film on the sides of a trench is reduced. It is thus possible to minimize line resistance of the line.

Second, since a thickness of a barrier metal film on the sides of a trench can be reduced, generation of a void or seam upon deposition of a line material can be prevented. It is therefore possible to prevent a line resistance increase phenomenon depending upon generation of that void or seam.

Third, a thickness of a barrier metal film by the CVD method having a relatively long process time is reduced, and a barrier metal film is formed by the PVD method having a relatively short process time. It is thus possible to shorten a Turn Around Time (TAT).

Fourth, since defect factors such as the void and seam can be prevented, the yield of devices can be improved.

Although the foregoing description has been made with reference to the above embodiments, it is to be understood that changes and modifications of the present invention may be made by a person of ordinary skill in the art without departing from the spirit and scope of the present invention and appended claims.

What is claimed is:

1. A method of forming a line in a semiconductor device, the method comprising:
   forming an interlayer insulating film on a semiconductor substrate in which predetermined structures are formed;
   forming a trench through which a predetermined region of the semiconductor substrate is exposed in the interlayer insulating film;
   sequentially forming a glue layer and a first barrier metal film on the entire surface including the trench;
   forming a second barrier metal film at the bottom of the trench and on the first barrier metal film formed outside of the trench; and
   forming a line within the trench.

2. The method as claimed in claim 1, wherein the first barrier metal film is formed by means of a CVD process.

3. The method as claimed in claim 2, wherein the first barrier metal film is formed to a thickness of 20 to 50 Å.

4. The method as claimed in claim 1, wherein the first barrier metal film is formed by means of an ALD process.

5. The method as claimed in claim 4, wherein the first barrier metal film is formed to a thickness thinner than 20 Å.

6. The method as claimed in claim 1, wherein the second barrier metal film is formed using one of TiN, WN and TaN.

7. The method as claimed in claim 1, further comprising the step of deposing a line material on the entire surface including the trench after formation of the second barrier metal film so that the trench is buried; and
   performing a polishing process to planarize the upper surface of the resulting structure and to expose the interlayer insulating film after deposition of the line material.

8. The method as claimed in claim 1, wherein the second barrier metal film is formed to a thickness of 50 to 100 Å.

9. The method as claimed in claim 1, wherein the line is formed using one of W, Ti, TiN, W alloy, Al alloy and Cu.

10. The method as claimed in claim 1, wherein the second barrier metal film is formed by means of a PVD method.

11. The method as claimed in claim 10, wherein the second barrier metal film is formed by means of a collimate PVD or ionized PVD.

12. The method as claimed in claim 11, wherein if the second barrier metal film is formed by means of collimate PVD, the second barrier metal film is formed under the conditions having a pressure of 10 to 50 mTorr, DC power of 1000 to 5000 Watt, and RF power of 500 to 5000 Watt.

13. The method as claimed in claim 11, wherein if the second barrier metal film is formed by means of ionized PVD, the second barrier metal film is formed under the conditions having a pressure of 10 to 50 mTorr, DC power of 1000 to 5000 Watt, RF power of 500 to 5000 Watt, and AC power of 100 to 500 Watt.

14. A method of forming a line in a semiconductor device, the method comprising:
   forming an interlayer insulating film on a semiconductor substrate in which predetermined structures are formed;
   forming a trench through which a predetermined region of the semiconductor substrate is exposed in the interlayer insulating film;
   sequentially forming a glue layer and a first barrier metal film on the entire surface including the trench;
   forming a second barrier metal film at the bottom of the trench and on the first barrier metal film formed outside of the trench;
   depositing a line material so that the trench is buried; and
   polishing the surface so that the interlayer insulating film is exposed, thereby forming a line within the trench.

15. The method as claimed in claim 14, wherein the first barrier metal film is formed by means of a CVD process.

16. The method as claimed in claim 15, wherein the first barrier metal film is formed to a thickness of 20 to 50 Å.

17. The method as claimed in claim 14, wherein the first barrier metal film is formed by means of an ALD process.

18. The method as claimed in claim 17, wherein the first barrier metal film is formed to a thickness thinner than 20 Å.

19. The method as claimed in claim 14, wherein the second barrier metal film is formed using one of TiN, WN and TaN.

20. The method as claimed in claim 14, wherein the second barrier metal film is formed to a thickness of 50 to 100 Å.

21. The method as claimed in claim 14, wherein the line is formed using one of W, Ti, TiN, W alloy, Al alloy and Cu.

22. The method as claimed in claim 14, wherein the second barrier metal film is formed by means of a PVD method.

23. The method as claimed in claim 22, wherein the second barrier metal film is formed by means of a collimate PVD or ionized PVD.

24. The method as claimed in claim 23, wherein if the second barrier metal film is formed by means of collimate PVD, the second barrier metal film is formed under the conditions having a pressure of 10 to 50 mTorr, DC power of 1000 to 5000 Watt, and RF power of 500 to 5000 Watt.

25. The method as claimed in claim 23, wherein if the second barrier metal film is formed by means of ionized PVD, the second barrier metal film is formed under the conditions having a pressure of 10 to 50 mTorr, DC power of 1000 to 5000 Watt, RE power of 500 to 5000 Watt, and AC power of 100 to 500 Watt.

26. A method of forming a line in a flash memory device, the method comprising:
   forming an interlayer insulating film on a semiconductor substrate in which a stack gate and spacers are formed;
   forming a trench through which a predetermined region of the semiconductor substrate is exposed in the interlayer insulating film;
   sequentially forming a glue layer and a first barrier metal film on the entire surface including the trench;

forming a second barrier metal film at the bottom of the trench and on the first barrier metal film formed outside of the trench; and forming a line within the trench.

27. The method as claimed in claim 26, wherein the stack gate is formed by sequentially laminating a tunneling oxide film, a floating gate, an integrated insulating film, and a control gate.

28. The method as claimed in claim 26, wherein the first barrier metal film is formed by means of a CVD process.

29. The method as claimed in claim 28, wherein the first barrier metal film is formed to a thickness of 20 to 50 Å.

30. The method as claimed in claim 26, wherein the first barrier metal film is formed by means of an ALD process.

31. The method as claimed in claim 30, wherein the first barrier metal film is formed to a thickness thinner than 20 Å.

32. The method as claimed in claim 26, wherein the second barrier metal film is formed using one of TiN, WN and TaN.

33. The method as claimed in claim 26, further comprising the step of deposing a line material on the entire surface including the trench after formation of the second barrier metal film so that the trench is buried; and performing a polishing process to planarize the upper surface of the resulting structure and to expose the interlayer insulating film after deposition of the line material.

34. The method as claimed in claim 26, wherein the second barrier metal film is formed to a thickness of 50 to 100 Å.

35. The method as claimed in claim 26, wherein the line is formed using one of W, Ti, TiN, W alloy, Al alloy and Cu.

36. The method as claimed in claim 26, wherein the second barrier metal film is formed by means of a PVD method.

37. The method as claimed in claim 36, wherein the second barrier metal film is formed by means of a collimate PVD or ionized PVD.

38. The method as claimed in claim 37, wherein if the second barrier metal film is formed by means of collimate PVD, the second barrier metal film is formed under the conditions having a pressure of 10 to 50 mTorr, DC power of 1000 to 5000 Watt, and RF power of 500 to 5000 Watt.

39. The method as claimed in claim 37, wherein if the second barrier metal film is formed by means of ionized PVD, the second barrier metal film is formed under the conditions having a pressure of 10 to 50 mTorr, DC power of 1000 to 5000 Watt, RF power of 500 to 5000 Watt, and AC power of 100 to 500 Watt.

* * * * *